(12) United States Patent
Satoh et al.

(10) Patent No.: US 8,591,653 B2
(45) Date of Patent: Nov. 26, 2013

(54) COMPOUND SEMICONDUCTOR SINGLE-CRYSTAL MANUFACTURING DEVICE AND MANUFACTURING METHOD

(75) Inventors: Issei Satoh, Itami (JP); Naho Mizuhara, Itami (JP); Keisuke Tanizaki, Itami (JP); Michimasa Miyanaga, Itami (JP); Takashi Sakurada, Itami (JP); Hideaki Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 562 days.

(21) Appl. No.: 12/668,426

(22) PCT Filed: Mar. 6, 2009

(86) PCT No.: PCT/JP2009/054281
§ 371 (c)(1),
(2), (4) Date: Jan. 10, 2010

(87) PCT Pub. No.: WO2009/113455
PCT Pub. Date: Sep. 17, 2009

(65) Prior Publication Data
US 2010/0319614 A1    Dec. 23, 2010

(30) Foreign Application Priority Data

Mar. 11, 2008 (JP) .................. 2008-061444

(51) Int. Cl.
*C30B 21/02* (2006.01)
(52) U.S. Cl.
USPC .............. 117/108; 117/109; 117/84; 117/905
(58) Field of Classification Search
USPC ................... 117/108, 109, 84, 905
See application file for complete search history.

(56) References Cited

U.S. PATENT DOCUMENTS 4,737,232 A * 4/1988 Flicstein et al. ............... 427/509
4,970,196 A * 11/1990 Kim et al. ..................... 505/474
(Continued)

FOREIGN PATENT DOCUMENTS

CN  1381870 A  11/2002
EP  1244139 A2  9/2002
(Continued)

OTHER PUBLICATIONS

Myunghee Kim et al., "Epitaxial Growth Mechanisms of AlN on SiC Substrates at Room Temperature," Applied Physics Letters, Oct. 9, 2007, pp. 151903-1 to 15193-3, vol. 91, No. 15, American Institute of Physics, NY.

*Primary Examiner* — Bob M Kunemund
(74) *Attorney, Agent, or Firm* — James W. Judge

(57) ABSTRACT

A compound semiconductor single-crystal manufacturing device (1) is furnished with: a laser light source (6) making it possible to sublime a source material by directing a laser beam onto the material; a reaction vessel (2) having a laser entry window (5) through which the laser beam output from the laser light source (6) can be transmitted to introduce the beam into the vessel interior, and that is capable of retaining a starting substrate (3) where sublimed source material is recrystallized; and a heater (7) making it possible to heat the starting substrate (3). The laser beam is shone on, to heat and thereby sublime, the source material within the reaction vessel (2), and compound semiconductor single crystal is grown by recrystallizing the sublimed source material onto the starting substrate (3); afterwards the laser beam is employed to separate the compound semiconductor single crystal from the starting substrate (3).

11 Claims, 8 Drawing Sheets

(56) References Cited

U.S. PATENT DOCUMENTS

| | | | |
|---|---|---|---|
| 5,080,753 A * | 1/1992 | Doll et al. | 117/108 |
| 5,139,591 A * | 8/1992 | Doll et al. | 117/108 |
| 6,037,313 A * | 3/2000 | Nagaishi et al. | 505/474 |
| 6,447,606 B2 * | 9/2002 | Imaeda et al. | 117/108 |
| 2002/0166502 A1 | 11/2002 | Vaudo et al. | |
| 2002/0182889 A1 | 12/2002 | Solomon et al. | |

FOREIGN PATENT DOCUMENTS

| | | |
|---|---|---|
| JP | 2002-222772 A | 8/2002 |
| JP | 2003-328113 A | 11/2003 |
| JP | 2005-159333 A | 6/2005 |
| JP | 2005-200250 A | 7/2005 |
| JP | 2008-053640 A | 3/2008 |
| WO | WO-03-020497 A1 | 3/2003 |

* cited by examiner

COMPOUND SEMICONDUCTOR SINGLE-CRYSTAL MANUFACTURING DEVICE AND MANUFACTURING METHOD

TECHNICAL FIELD

The present invention relates to devices and methods for manufacturing compound semiconductor single crystal.

BACKGROUND ART

Monocrystalline compound semiconductor materials, which are single crystals such as aluminum nitride (also termed "AlN" hereinafter) and gallium nitride (also termed "GaN" hereinafter), to date have been employed in a variety of applications. For example, AlN can be employed in heat sinks, as a material for semiconductor manufacturing devices, and in thin-film pressure sensors, while GaN can be employed in light-emitting devices and electronic devices.

Monocrystalline compound semiconductor materials such as the AlN and GaN single crystal just mentioned are producible by, for example, sublimation deposition. Sublimation is a growth technique whereby source material inside a reaction vessel such as a crucible is put at a high temperature to sublime the material and re-deposit crystal in a lower-temperature area. Sublimation deposition includes techniques based on self-seeding, which do not use starting substrates, and techniques that use monocrystalline heterosubstrates as starting substrates.

In instances where compound semiconductor single crystal is grown using a starting substrate, the necessity of separating the starting substrate and the compound semiconductor single crystal arises. A variety of approaches, such as forming a concave-convex structure in the surface of the starting substrate, in order to be able to carry out separation of the starting substrate and the compound semiconductor single crystal with ease have come about. Herein, Japanese Unexamined Pat. App. Pub. No. 2005-159333 (Patent Document 1) sets forth technology according to which the removal side of a substrate is scribed or laser-beam irradiated to form initiators, whereby the substrate is removed.

Patent Document 1: Japanese Unexamined Pat. App. Pub. No. 2005-159333.

DISCLOSURE OF INVENTION

Problems Invention is to Solve

In situations where crystal is grown by sublimation, direct observation of the reaction vessel interior from outside the device during crystal growth presents difficulties. Consequently, judging the point when the source material has finished sublimating inside the reaction vessel proves to be challenging. A problem that can occur as a result is that crystal once grown is yet heated, such that the crystal despite already having been grown ends up being re-sublimed.

Furthermore, when the temperature of the entire reaction vessel interior is ramped up to grow crystal onto a starting substrate, if the difference in thermal expansion coefficient between the starting substrate and the growth crystal is large, during ramp-down of the grown crystal, the stress acting on the interface between the starting substrate and the growth crystal will prove to be considerable. A problem that can then occur if the growth crystal cannot withstand the stress is that cracking will arise in the growth crystal.

The present invention was brought about in order to resolve issues such as the foregoing, and the present-invention goal takes as its object to make available a compound semiconductor single-crystal manufacturing device and manufacturing method that make it possible to restrain sublimation of growth crystal inside a reaction vessel, and make it possible to minimize the occurrence of cracking in growth crystal after cooling of the growth crystal.

Means for Resolving the Problems

A compound semiconductor single-crystal manufacturing device involving the present invention is furnished with: a laser light source making it possible to sublime a source material by directing a laser beam onto the material; a reaction vessel that has a laser entry window through which the laser beam output from the laser light source can be transmitted to introduce the beam into the vessel interior, and that is capable of retaining a starting substrate where sublimed source material is recrystallized; and a heater making it possible to heat the starting substrate.

The source material may a sintered source powder, for example. In that case, the sintered source powder should be installable on the laser entry window. Also, inside the reaction vessel it may be made so that the starting substrate is retained in a position opposite the laser entry window.

The compound semiconductor single-crystal manufacturing device just described may be further furnished with a sensor making it possible to detect a change of state in the starting substrate when the laser beam is shone on the starting substrate.

The laser light source may be movable, and a plurality of laser light sources may be installed. While the laser light source conceivably is shifted, swiveled and tilted in any preferred direction, a mechanism may be installed to enable the light source to shift, swivel, tilt, etc. in a direction that is, for example, orthogonal to the output direction of the laser beam. And in cases where plural laser light sources are installed, a plurality of laser light sources enabling laser beams of the same kind to be emitted may be employed, or a plurality of laser light sources enabling laser beams of differing kind to be emitted may be employed.

A compound semiconductor single-crystal manufacturing method involving the present invention is furnished with the following steps. A source material installed inside a reaction vessel is sublimed by a laser beam being directed onto the source material to heat it. The sublimed source material is recrystallized onto a starting substrate to grow compound semiconductor single crystal. After formation of the compound semiconductor single crystal, the laser beam is employed to separate the compound semiconductor single crystal from the starting substrate.

The wavelength of the laser beam may be determined in such a way that the amount of energy that the starting substrate absorbs will be greater than the amount of energy that the compound semiconductor single crystal absorbs. Further, in the foregoing separation step, the starting substrate may be separated from the compound semiconductor single crystal by the laser beam being directed at the interface between the compound semiconductor single crystal and the starting substrate to remove at least a portion of the starting substrate.

In the foregoing crystal growth step, it is preferable to grow the compound semiconductor single crystal with the starting substrate being heated at a temperature higher than the temperature of the space inside the reaction vessel. That is, it is preferable to grow the compound semiconductor single crystal without heating the space inside the reaction vessel entirely, but with the starting substrate being heated (with the space inside the reaction vessel being heated locally).

The progress status of the foregoing sublimation step can be monitored by detecting a change of state in the starting substrate from the laser beam being shone on the starting substrate. For example, by detecting a change in the temperature of the starting substrate or a change in the amount current flowing in the starting substrate from the laser beam being shone on the starting substrate, the progress status of the foregoing sublimation step can be monitored.

It is preferable to make the foregoing sublimation step, crystal growth step, and separation step be carried out in succession and automatedly.

Effects of the Invention

With the present invention, since the source material is sublimed by a laser beam being directed onto the source material, by, for example, detecting the extent to which the laser beam transmits through the source material the point when a desired amount of source material has finished subliming can judged. Accordingly, the laser beam can be stopped at the point when the source material has finished subliming, making it possible to avert the growth crystal being heated unnecessarily with the laser beam for heating the source material. As a result, within the reaction vessel subliming of the growth crystal can effectively be controlled to a minimum.

Furthermore, since it is possible to separate the compound semiconductor single crystal from the starting substrate employing the laser beam, the compound semiconductor single crystal can be separated from the starting substrate before the compound semiconductor single crystal is cooled. This makes it possible to effectively restrain occurrence, originating in the presence of the starting substrate during cooling of the growth crystal, of cracking in the growth crystal after the growth crystal is cooled.

LEGEND

Figure 1:
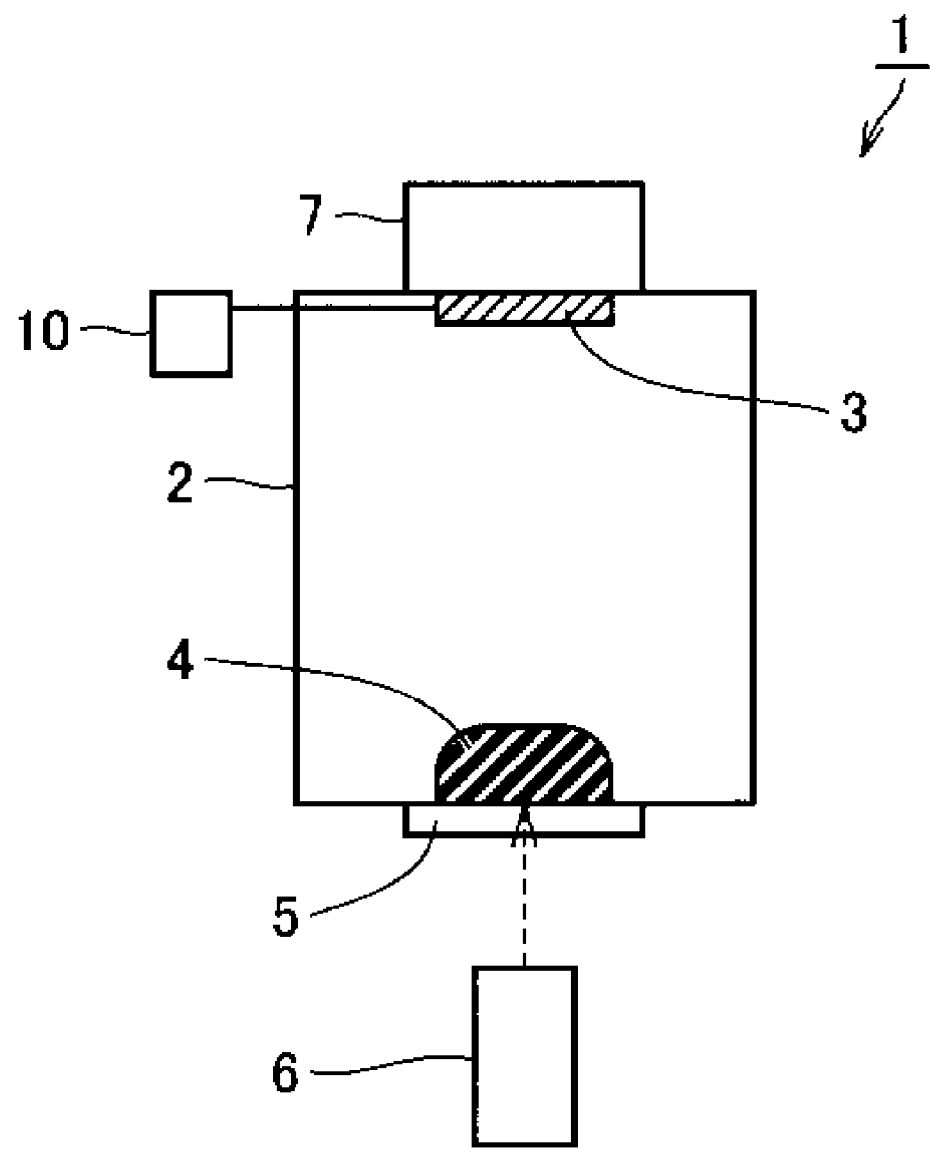
FIG. 1 is a sectional view illustrating one step during a compound semiconductor single-crystal manufacturing procedure utilizing a compound semiconductor single-crystal manufacturing device in Embodying Mode 1 of the present invention.

1: compound semiconductor single-crystal manufacturing device
2: reaction vessel
3: starting substrate
4: source material
5: laser entry window
6: laser light source
7: heater
8: compound semiconductor single crystal
9: laser drive mechanism
10: sensor

BEST MODE FOR CARRYING OUT THE INVENTION

Below, using FIG. 1 through FIG. 8, a description of a mode of embodying the present invention will be made.

Embodying Mode 1

Figure 2:
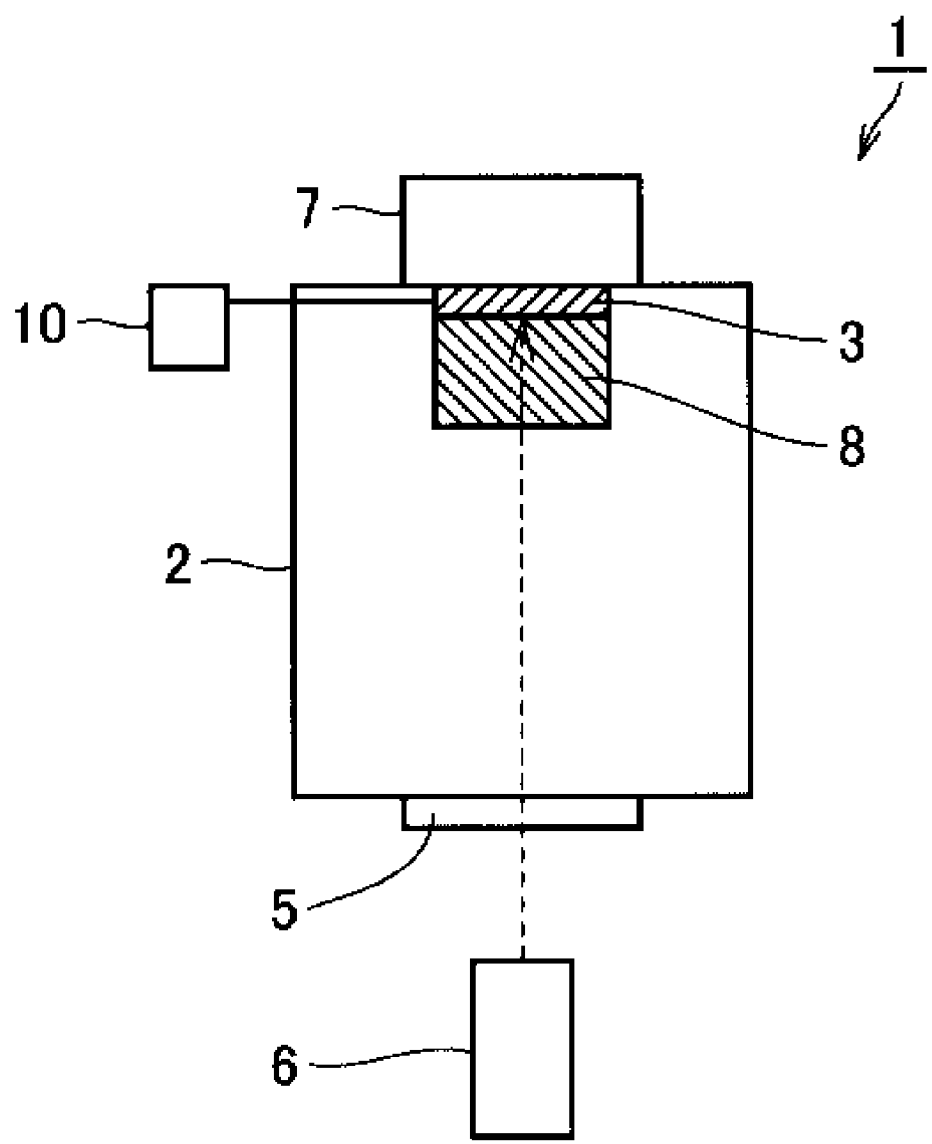
FIG. 2 is a sectional view illustrating another step during a compound semiconductor single-crystal manufacturing procedure utilizing a compound semiconductor single-crystal manufacturing device in Embodying Mode 1 of the present invention.

To begin with, using FIGS. 1 and 2 an explanation of Embodying Mode 1 of the present invention will be made. FIGS. 1 and 2 are sectional views illustrating special steps in the manufacture of compound semiconductor single crystal utilizing a compound semiconductor single-crystal manufacturing device 1 in present Embodying Mode 1.

As illustrated in FIGS. 1 and 2, in present Embodying Mode 1 a device 1 for manufacturing compound semiconductor single crystal 8 is furnished with: a reaction vessel 2, such as a crucible; a laser light source 6; a heater 7; and a sensor 10.

The reaction vessel 2 has a laser entry window 5 through which a laser beam output from the laser light source 6 can be transmitted and introduced into the interior, and a holder whereby a starting substrate 3 can be retained. The laser entry window 5 is fitted, in the FIG. 1 and FIG. 2 example, into the bottom part of the reaction vessel 2, and can be constituted by, for example, a synthetic quartz. A source material 4 for the compound semiconductor single crystal 8 as the growth crystal is placed atop the laser entry window 5.

The starting substrate 3 is a base material for recrystallizing the sublimed source material 4 inside the reaction vessel 2. For the starting substrate 3, typically a substrate of a material different from the compound semiconductor single crystal 8 is employed. For example, in cases where AlN single crystal is grown, a compound semiconductor substrate, such as an SiC substrate or the like, of a material other than AlN can be employed as the starting substrate 3.

As illustrated in FIGS. 1 and 2, the starting substrate 3 is installed within the reaction vessel 2 in a position that is opposite the laser entry window 5. The laser light source 6 is installed underneath the laser entry window 5 (along the side of the laser entry window 5 that is the reverse of its starting substrate 3 side), with the laser light source 6, the laser entry window 5, and the starting substrate 3 being disposed, in that order, so as to be rowed up along the same straight line (for example, the optical axis of the laser beam).

The laser beam output from the laser light source 6 can thereby be directed both onto the source material 4 placed atop the laser entry window 5, and onto the starting substrate 3.

A compound semiconductor sintered material, like a sintered AlN powder for example, can be used for the source material 4. In that case, given that permeation of the laser beam output from the laser light source 6 should be effectively minimized, one option, for example, would be to use a sintered powder whose maximum grain size is some 100 µm.

Any preferred configuration can be adopted for the holder, as long as it is capable of retaining the starting substrate 3 inside the reaction vessel 2—any of a variety of mechanisms or jigs, such as a substrate retaining table or a substrate retaining arm, can be used.

The laser light source 6 sublimes the source material 4 by irradiating the source material 4 with a laser beam. For the laser light source 6, an ArF excimer laser (wavelength 193 nm), a KrF excimer laser (wavelength 248 nm), a fourth-harmonic generation (FHG) yttrium aluminum garnet (YAG) laser (wavelength 266 nm), or a second-harmonic generation (SHG) Ar laser (wavelength 244 nm) can be used for example.

The wavelength of the laser beam output from the laser light source 6 is established so that the amount of laser-beam energy that the starting substrate 3 absorbs will be greater than the amount of laser-beam energy that the compound semiconductor single crystal 8 absorbs. That is, the just-noted wavelength of the laser beam is determined in such a way as to be greater than the bandgap energy Eg of the starting substrate 3, and less than the bandgap energy Eg of the compound semiconductor single crystal 8. This makes it possible to direct the laser beam through the compound semiconductor single crystal 8 and onto the starting substrate 3, to remove at least a portion of the starting substrate 3 yet preserve the compound semiconductor single crystal 8.

The heater 7 heats the starting substrate 3. Typically the heater 7 is disposed in the vicinity of the starting substrate 3, to heat not the space inside the reaction vessel 2, but the starting substrate 3. In the FIG. 1 and FIG. 2 instance, the heater 7 is disposed along the exterior of the reaction vessel 2, on the upper side (rear side) of the starting substrate 3, but can be disposed in a location apart from that. Any heater of choice, such as a resistive-heating heater or a lamp heater, can be used for the heater 7.

The sensor 10 is a sensor able to detect a change of state (physical phenomena) in the starting substrate 3 wherein the starting substrate 3 is irradiated with a laser beam. When a laser beam is shone onto the starting substrate 3, the state (physical phenomena) of the starting substrate 3 change(s). For example, if the starting substrate 3 is an electroconductive substrate, a minute current will flow in the starting substrate 3, and if the starting substrate 3 is an electroinsulative substrate, the starting substrate temperature will change.

Accordingly, if the starting substrate 3 is an electroconductive substrate, an ammeter such as a picoammeter is used for the sensor 10, and if the starting substrate 3 is an electroinsulative substrate, a temperature sensor able to detect change in temperature of the starting substrate 3 can be employed as the sensor 10.

Employing a sensor 10 such as the foregoing enables detection of a change of state (physical phenomena) in the starting substrate 3, and makes it possible to detect information including whether a laser beam has been shone on the starting substrate 3, and how much the amount of laser light is that has been shone onto the starting substrate 3. As a result, information including the status of the progress of the source material 4 sublimation step, and whether the sublimation step has concluded can be monitored.

Next, a method, in Embodying Mode 1, of manufacturing a compound semiconductor single crystal 8 will be explained.

At first, the source material 4 is prepared. The source material 4 typically is rendered into a solid-phase state. For example, in cases where AlN single crystal is grown as the compound semiconductor single crystal 8, sintered AlN powder can be used as the source material 4. The sintered AlN powder can be produced for example by press-molding AlN powder to create a molded compact, and calcining the molded compact for two hours at 2000° C. within a vacuum chamber (under a pressure of $10^{-6}$ torr) having a nitrogen atmosphere. Herein, in cases where compound semiconductor single crystal 8 other than AlN single crystal is grown, a specified compound semiconductor powder can be used to produce a sintered compact by the same technique as just described.

The sintered AlN compact obtained in the foregoing manner is set into the interior of the reaction vessel 2 depicted in FIG. 1. Specifically, the sintered AlN compact is set atop the laser entry window 5 represented in FIG. 1. In the FIG. 1 example, the sintered AlN compact is placed directly onto the laser entry window 5, but the sintered AlN compact may be set above the laser entry window 5 by means of a carrying platform or the like, consisting of a material through which the laser light is transmissible. Meanwhile, the starting substrate 3 is also set into position, opposite the source material 4 and inside the reaction vessel 2.

Next, as indicated in FIG. 1, the laser beam output from the laser light source 6 is directed onto the source material 4 installed in the reaction vessel 2 interior. The source material 4 is irradiated, for example, with an ArF excimer laser (wavelength 193 nm). By appropriately adjusting the power and other parameters of the laser, the source material 4 can be heated to sublime the material. One option, for example, would be to have the power density of the laser be some 1 J/cm².

At that point, the entirety of the source material 4 set onto the laser entry window 5 does not necessarily have to be sublimed; it is acceptable that a portion of the source material 4 atop the laser entry window 5 remain. It is necessary, however, that the amount of source material 4 remaining on the laser entry window 5 be of a level that allows laser light of a predetermined intensity or greater to shine on the starting substrate 3 in the later steps. For example, if the proportion obstructing the laser entry window 5 is some 10% or less, it presumably would be within permissible range.

The source material 4 having sublimed in the reaction vessel 2 interior is recrystallized onto the starting substrate 3. As indicated in FIG. 2, a compound semiconductor single crystal 8 can thereby be grown onto the starting substrate 3. At that time, the reaction vessel 2 interior should be, for example, a nitrogen atmosphere, and the pressure should be some 10 to 100 kPa.

In the aforementioned crystal growth step, it is preferable to grow the compound semiconductor single crystal 8 with the starting substrate 3 being heated at a temperature higher than the temperature of the space inside the reaction vessel 2. That is, it is preferable to grow the compound semiconductor single crystal 8 without, in the conventional manner, installing a heater encompassing the reaction vessel 2 or adopting similar means to heat the starting substrate 3 by heating entirely the space inside the reaction vessel 2 to a high temperature, but instead with the starting substrate 3 being heated directly by the heater 7.

It should be noted that heating the starting substrate 3 with the heater 7 indirectly heats the space surrounding the starting substrate 3, yet presumably the temperature of the space inside the reaction vessel 2 ordinarily will be lower than the temperature of the starting substrate 3. In addition, a separate heater may be installed surrounding the reaction vessel 2, so as to maintain the temperature of the space inside the reaction vessel 2 at a predetermined temperature that is lower than the heating temperature of the starting substrate 3.

Therein, if the starting substrate 3 consists of an SiC substrate, a change in physical phenomena, such as a temperature change, in the starting substrate 3 is detected by the sensor 10. How much the amount of laser light is that has been shone onto the starting substrate 3 can thereby be detected, and other determinations, including the state of progress of the source material 4 sublimation step and the point when the source material 4 has finished subliming, can be made. Accordingly, at the stage where the source material 4 has finished subliming, the lasing directed onto the source material 4 can be stopped, making it possible to avert the compound semiconductor single crystal 8 as the growth crystal being unnecessarily irradiated with the laser beam. As a result, unnecessary heating of the compound semiconductor single crystal 8 can be averted, making it possible to effectively curb sublimation of the compound semiconductor single crystal 8 in the reaction vessel 2 interior.

After the compound semiconductor single crystal 8 is formed, laser light is employed to separate the compound semiconductor single crystal 8 from the starting substrate 3. For example, one option would be shining the laser beam through the compound semiconductor single crystal 8 and directing it at the interface between the compound semiconductor single crystal 8 and the starting substrate 3, to form, along the starting substrate 3 side, scratch-like features, which can serve as "initiators" in separating the starting substrate 3 from the compound semiconductor single crystal 8.

In the foregoing separation step, the configuration is rendered so that the starting substrate 3 is heated with the heater 7. The application of unnecessary stress, originating in the starting substrate 3 cooling, on the compound semiconductor single crystal 8 from the starting substrate 3, and owing to such factors as disparity in thermal expansion coefficient between the two, can thereby be controlled to a minimum.

Again, as described earlier, wavelength of the laser light is established so that, for example, the amount of laser-beam energy absorbed by the starting substrate 3 will be greater than the amount of laser-beam energy absorbed by the compound semiconductor single crystal 8. This means that at least a portion of the starting substrate 3 can be removed, making it possible easily to form the aforementioned "scratch-like features," and pits, etc. along the starting substrate 3 side. These features are exploited to enable separating the compound semiconductor single crystal 8 from the starting substrate 3 with ease.

Herein, irradiating the starting substrate 3 with the laser beam to remove the starting substrate 3 entirely makes it possible to separate the compound semiconductor single crystal 8 from the starting substrate 3 automatedly and reliably, while another possibility would be to remove upwards of 70% or so of the starting substrate 3, and exploit the mass of the compound semiconductor single crystal 8 to drop the compound semiconductor single crystal 8 onto the bottom part of the reaction vessel 2, to enable automatic separation of the compound semiconductor single crystal 8 from the starting substrate 3.

An alternative configuration may be such that with the starting substrate 3 having been partially removed by the use of laser light, the compound semiconductor single crystal 8 is separated from the starting substrate 3 by means such as, for example, using a mechanical arm or the like to apply external force to the compound semiconductor single crystal 8.

While typically it is the case that the compound semiconductor single crystal 8 having been separated from the starting substrate 3 falls onto the bottom part of the reaction vessel 2, implementing surface treatments and like processes on the compound semiconductor single crystal 8 in later steps makes it possible to employ the compound semiconductor single crystal 8 as a substrate or the like for various electronic devices.

Utilizing laser light as described above to separate the compound semiconductor single crystal 8 from the starting substrate 3 makes it possible to separate the compound semiconductor single crystal 8 from the starting substrate 3 in the reaction vessel 2 interior, prior to cooling of the compound semiconductor single crystal 8. This makes it possible to effectively curb occurrence, originating in the presence of the starting substrate 3 during cooling of the compound semiconductor single crystal 8, of cracking in the compound semiconductor single crystal 8 after the compound semiconductor single crystal 8 is cooled. And in implementations where the foregoing separation step is carried out utilizing laser light alone, new equipment for the separation step will be unnecessary, making it possible to reduce manufacturing costs.

Furthermore, with a compound semiconductor single-crystal 8 manufacturing method according to present Embodying Mode 1, since laser light is utilized, the source-material 4 sublimation step, the crystal growth step, and the separation step can be carried out inside the reaction vessel 2 in succession and automatedly. This means that compound semiconductor single crystal 8 can be manufactured efficiently, such that still further manufacturing cost reduction can be expected.

What is more, inasmuch as utilizing the sensor 10 makes it possible, as described above, to detect the status of the progress of the source-material 4 sublimation step, and the point when the source material 4 has finished subliming, sublimation of the compound semiconductor single crystal 8 in the reaction vessel 2 interior can effectively be controlled to a minimum, which promises improvement in yields.

Embodying Mode 2

Figure 3:
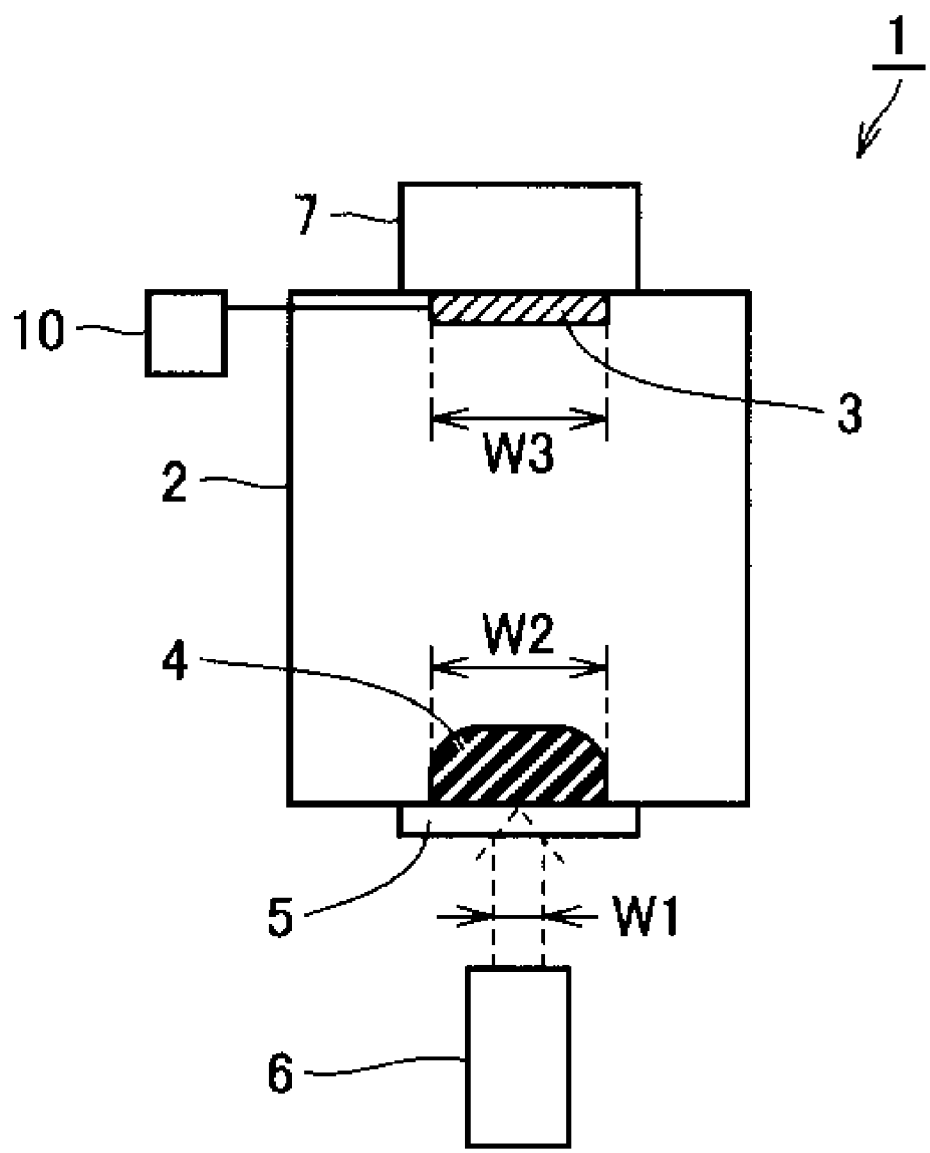
FIG. 3 is a sectional view illustrating one step during a compound semiconductor single-crystal manufacturing procedure utilizing a compound semiconductor single-crystal manufacturing device in Embodying Mode 2 of the present invention.
Figure 4:
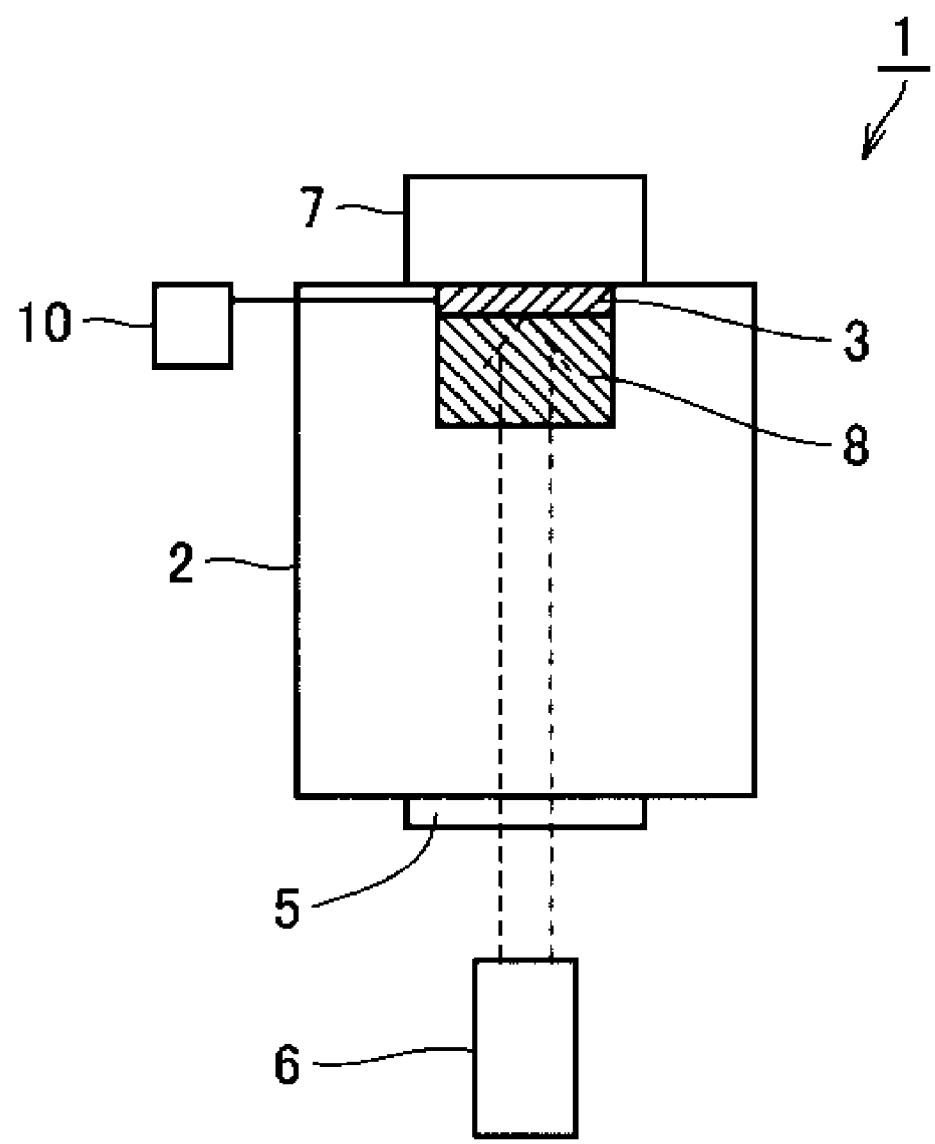
FIG. 4 is a sectional view illustrating another step during a compound semiconductor single-crystal manufacturing procedure utilizing a compound semiconductor single-crystal manufacturing device in Embodying Mode 2 of the present invention.

Next, using FIGS. 3 and 4 an explanation of Embodying Mode 2 of the present invention will be made. FIGS. 3 and 4 are sectional views illustrating special steps in the manufacture of compound semiconductor single crystal utilizing a compound semiconductor single-crystal manufacturing device 1 in present Embodying Mode 2.

As illustrated in FIGS. 3 and 4, in a device 1, in present Embodying Mode 2, for manufacturing compound semiconductor single crystal 8, the illumination span of the laser beam from the laser light source 6 is varied. In more detail, compared with the implementation described above for Embodying Mode 1, the span of the laser beam illumination is broader.

In the FIG. 3 instance, the beam width W1 of the laser light is smaller than the width W2 of the source material 4 and the width W3 of the starting substrate 3, but may be of size equivalent to the width W2 of the source material 4 and the width W3 of the starting substrate 3. Likewise, the width W2 of the source material 4 is of size equivalent to the width W3 of the starting substrate 3, but the width W2 of the source material 4 may be smaller or may be larger than the width W3 of the starting substrate 3.

Apart from the foregoing, the Embodying Mode 2 implementation is basically the same as the Embodying Mode 1 implementation, and thus the same effects as with the Embodying Mode 1 implementation may be anticipated. Herein, in Embodying Mode 2, inasmuch as the beam width W1 of the laser light is larger than in the Embodying Mode 1 implementation, raising the laser power enables carrying out the sublimation step and separation step more efficiently than with the Embodying Mode 1 implementation.

Embodying Mode 3

Figure 5:
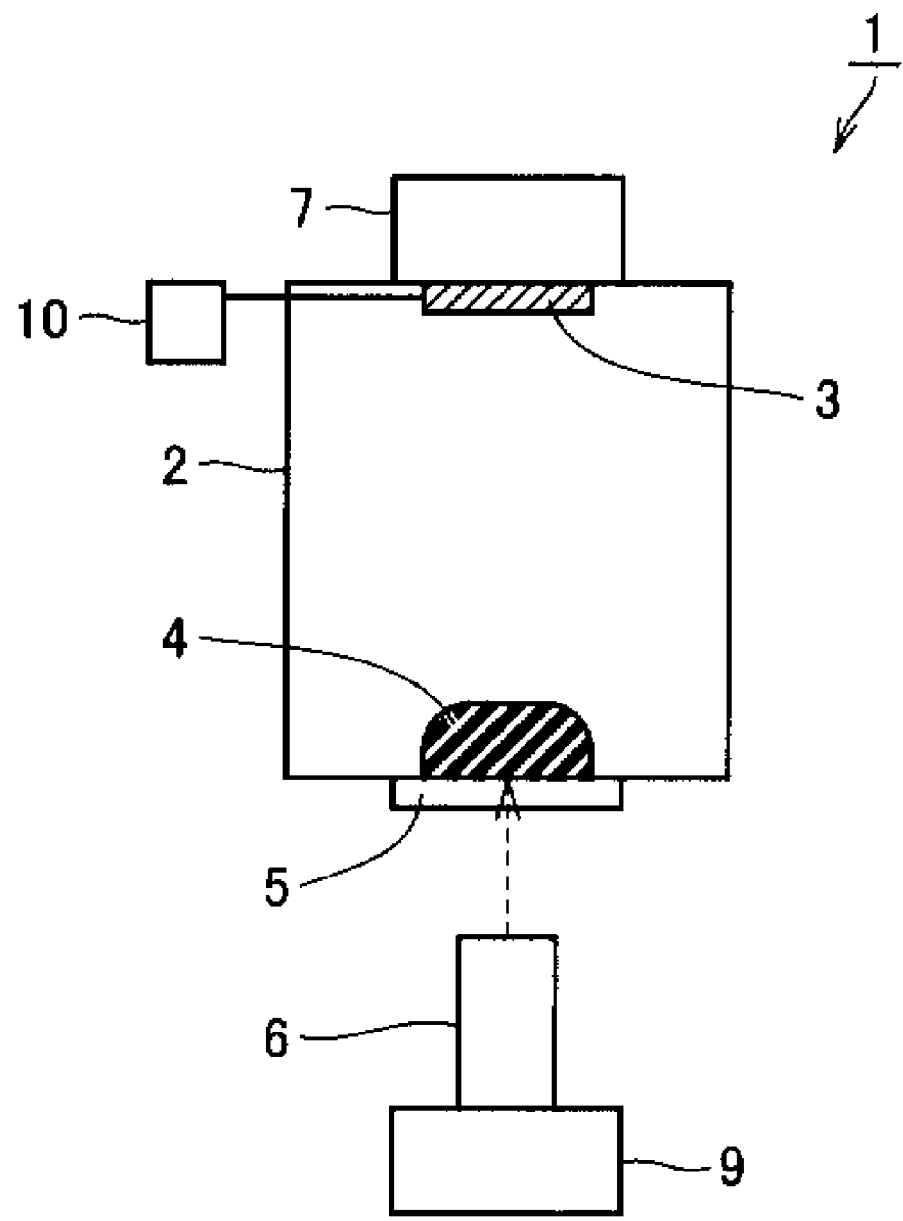
FIG. 5 is a sectional view illustrating one step during a compound semiconductor single-crystal manufacturing procedure utilizing a compound semiconductor single-crystal manufacturing device in Embodying Mode 3 of the present invention.
Figure 6:
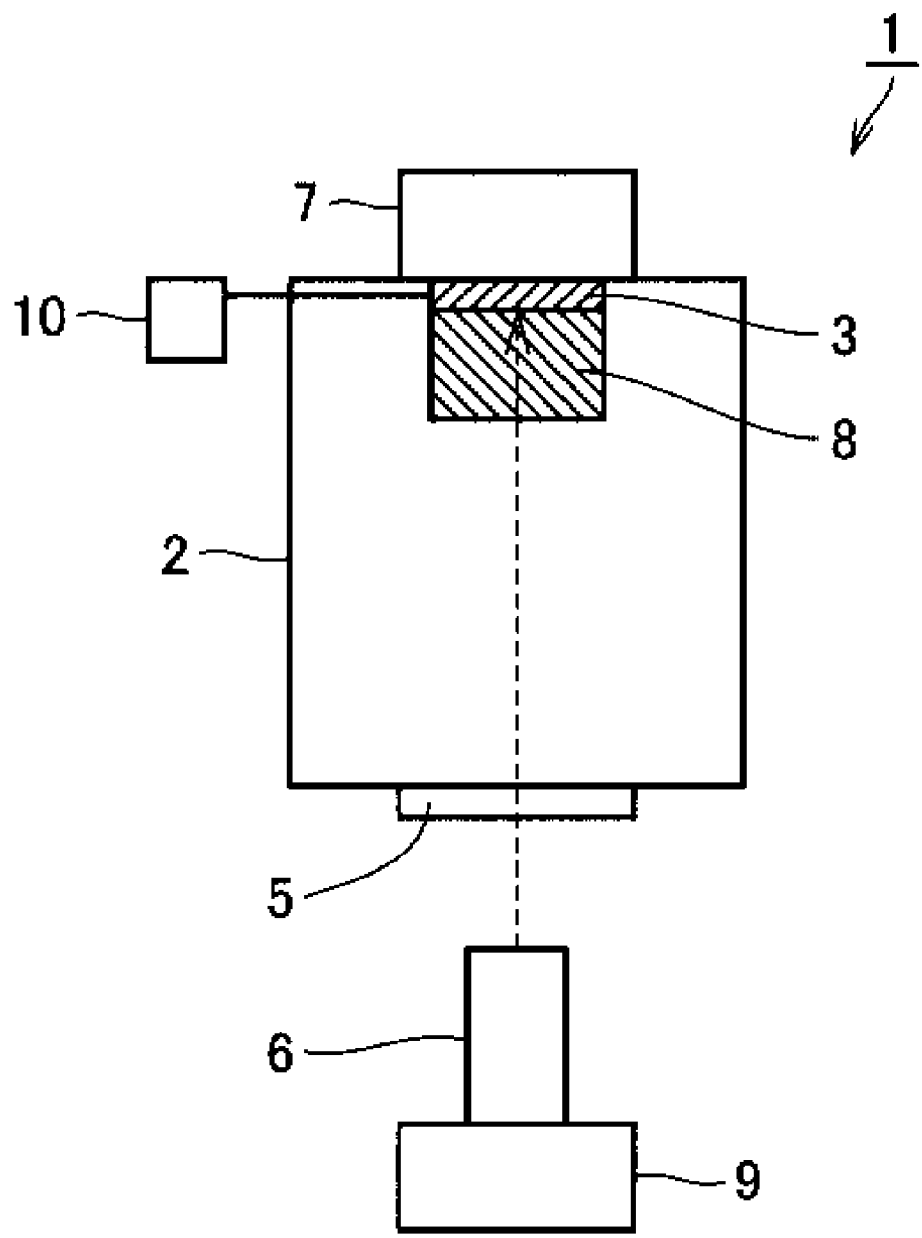
FIG. 6 is a sectional view illustrating another step during a compound semiconductor single-crystal manufacturing procedure utilizing a compound semiconductor single-crystal manufacturing device in Embodying Mode 3 of the present invention.

Next, using FIGS. 5 and 6 an explanation of Embodying Mode 3 of the present invention will be made. FIGS. 5 and 6 are sectional views illustrating special steps in the manufacture of compound semiconductor single crystal utilizing a compound semiconductor single-crystal manufacturing device 1 in present Embodying Mode 3.

As illustrated in FIGS. 5 and 6, in Embodying Mode 3, a laser drive mechanism 9 in order to drive the laser light source 6 is installed. The configuration apart from that is basically the same as that of the Embodying Mode 1 implementation.

The laser drive mechanism 9 is for driving the laser light source 6 and shifting or otherwise moving it in a desired direction, and in the FIG. 5 and FIG. 6 example, the laser light source 6 can be shifted along an orthogonal line at right angles to the output direction of the laser beam. The laser drive mechanism 9 may be a device furnished with, for example, a guide unit that guides the laser light source 6 in a desired direction, and a motive power source that imparts some sort of force to the laser light source 6 to shift it along the guide unit.

Providing a laser drive mechanism 9 such as just described makes it possible to direct the laser beam onto the source material 4 while shifting the laser light source 6 along an orthogonal line at right angles to the output direction of the laser beam. Herein, the configuration may such as to enable the laser light source 6 to shift in a chosen direction other than the foregoing orthogonal direction, or so that the laser light source 6 may be tilted, swiveled, etc.

Apart from the foregoing, the Embodying Mode 3 implementation is basically the same as the Embodying Mode 1 implementation, and thus the same effects as with the Embodying Mode 1 implementation may be anticipated. Herein, in Embodying Mode 3, since the source material 4 can be irradiated with the laser light while the laser light source 6 is shifted along the foregoing orthogonal line, a desired amount of source material can be reliably and easily sublimed.

Embodying Mode 4

Figure 7:
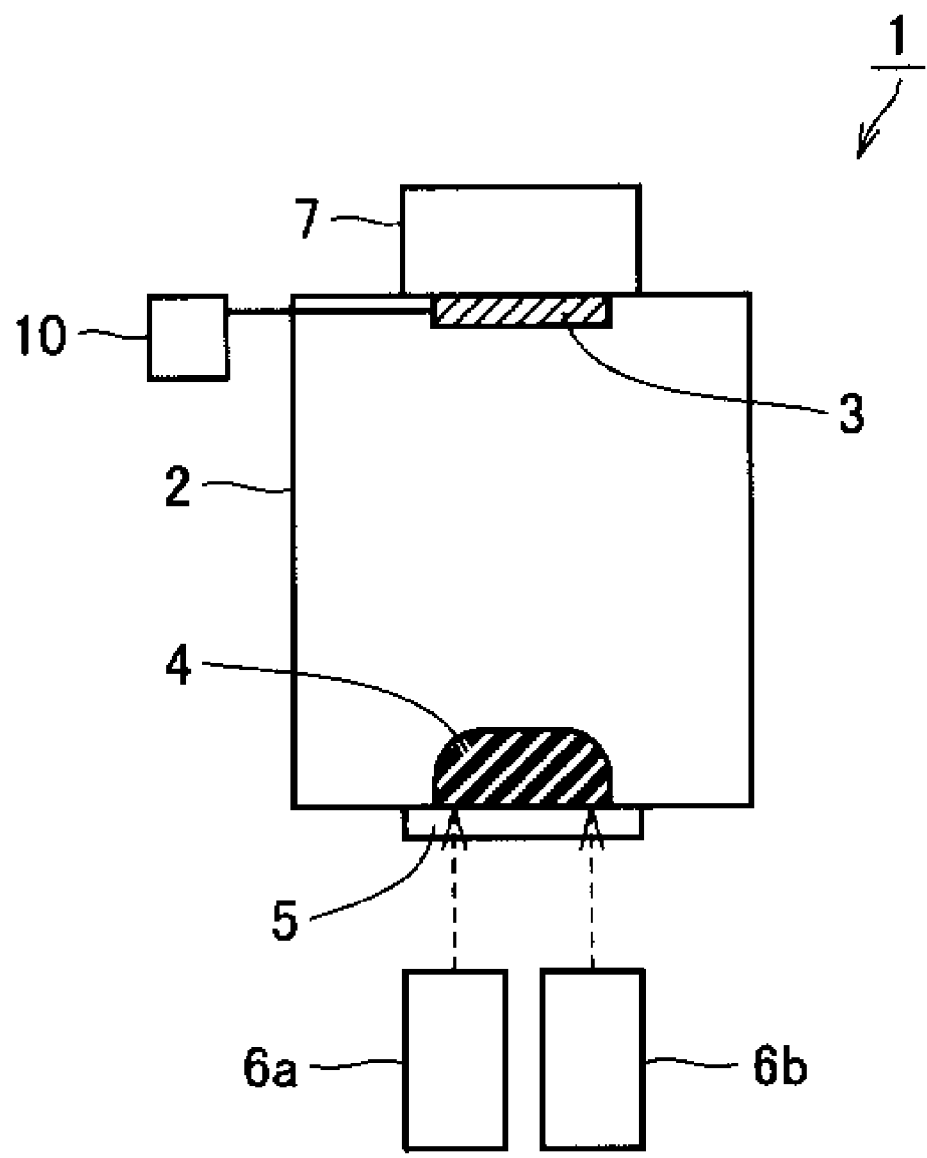
FIG. 7 is a sectional view illustrating one step during a compound semiconductor single-crystal manufacturing procedure utilizing a compound semiconductor single-crystal manufacturing device in Embodying Mode 4 of the present invention.
Figure 8:
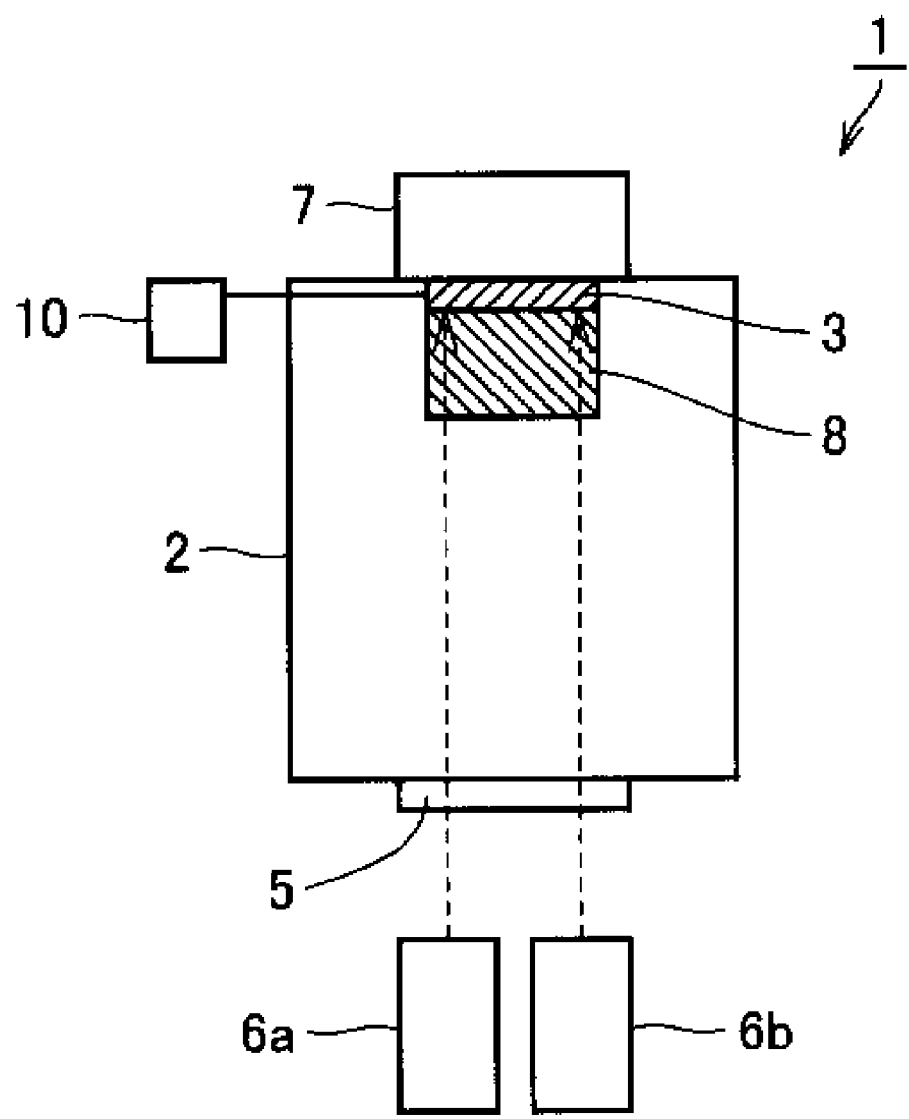
FIG. 8 is a sectional view illustrating another step during a compound semiconductor single-crystal manufacturing procedure utilizing a compound semiconductor single-crystal manufacturing device in Embodying Mode 4 of the present invention.

Next, using FIGS. 7 and 8 an explanation of Embodying Mode 4 of the present invention will be made. FIGS. 7 and 8 are sectional views illustrating special steps in the manufacture of compound semiconductor single crystal utilizing a compound semiconductor single-crystal manufacturing device 1 in present Embodying Mode 4.

As illustrated in FIGS. 7 and 8, in Embodying Mode 4, plural laser light sources 6a, 6b are installed. The configuration apart from that is basically the same as that of the Embodying Mode 1 implementation.

The laser light sources 6a, 6b may be laser light sources that are able to output laser beams of the same kind, or may be laser light sources that are able to output laser beams of differing kind And while in the FIG. 7 and FIG. 8 instance, two laser light sources are installed, it is possible to employ three or more laser light sources.

Apart from the foregoing, the Embodying Mode 4 implementation is basically the same as the Embodying Mode 1 implementation, and thus the same effects as with the Embodying Mode 1 implementation may be anticipated. Herein, in Embodying Mode 4, the fact that laser beams from a plurality of laser light sources can be employed makes it possible to output, for example, a laser beam customized to the foregoing sublimation step and a laser beam customized to the foregoing separation step from respective individual laser-light sources, enabling each step to be performed efficiently.

Compound semiconductor single crystal, such as AlN crystal, obtained by the manufacturing devices and manufacturing methods described above can be employed in a variety of applications, as follows.

The crystal can be employed as a substrate for all sorts of devices, including, for example, optoelectronic devices such as light-emitting diodes and laser diodes; semiconductor electronic devices such as rectifiers, bipolar transistors, field-effect transistors (FETs), and high electron mobility transistors (HEMTs); emitters; semiconductor sensors such as temperature sensors, pressure sensors, radiation sensors, and visible-blind ultraviolet detectors; and surface acoustic wave (SAW) devices, vibrators, resonators, microelectromechanical system (MEMS) parts, and piezoelectric actuators.

While a description of modes of embodying the present invention has been undertaken in the foregoing manner, combining the features of each of the embodying modes to suit is contemplated from the outset. Furthermore, the presently disclosed embodying modes should in all respects be considered to be illustrative and not limiting. The scope of the present invention is set forth by the scope of the patent claims, and includes meanings equivalent to the scope of the patent claims and all modifications within the scope.

The invention claimed is:

1. A compound semiconductor single-crystal manufacturing device comprising:
    a laser light source (6) enabled to sublime a source material by directing a laser beam onto the source material;
    a reaction vessel (2) having a laser entry window (5) through which the laser beam output from said laser light source (6) can be transmitted to introduce the beam into the vessel interior, and enabled to retain a starting substrate where sublimed source material is recrystallized; and
    a heater (7) enabled to heat the starting substrate; wherein the laser light source, the laser entry window, and the starting substrate are
    disposed, in that order, so as to be rowed up along a single straight line.

2. The compound semiconductor single-crystal manufacturing device set forth in claim 1, wherein the source material is a sintered source powder; the manufacturing device therein being configured in such a way that:
    the sintered source powder is installable on said laser entry window (5); and
    inside said reaction vessel (2) the starting substrate is retained in a position opposite said laser entry window (5).

3. The compound semiconductor single-crystal manufacturing device set forth in claim 1, further comprising a sensor (10) enabled to detect a change of state in the starting substrate when the laser beam is shone on the starting substrate.

4. The compound semiconductor single-crystal manufacturing device set forth in claim 1, wherein said laser light source (6) is movable.

5. The compound semiconductor single-crystal manufacturing device set forth in claim 1, having a plurality of said laser light sources (6).

6. A compound semiconductor single-crystal manufacturing method, comprising:
- a sublimation step of directing a laser beam from a laser light source (6) onto a source material installed inside a reaction vessel (2) having a laser entry window (5) to heat the source material, thereby subliming the source material;
- a crystal growth step of recrystallizing the sublimed source material onto a starting substrate (3) to grow compound semiconductor single-crystal (8); and
- a separation step, after formation of the compound semiconductor single-crystal (8), of employing the laser beam to separate the compound semiconductor single-crystal from the starting substrate (3); wherein
- the laser light source, the laser entry window, and the starting substrate are disposed, in that order, so as to be rowed up along a single straight line.

7. The compound semiconductor single-crystal manufacturing method set forth in claim 6, wherein the wavelength of the laser beam is determined in such a way that the amount of energy that the starting substrate (3) absorbs is greater than the amount of energy that the compound semiconductor single crystal (8) absorbs.

8. The compound semiconductor single-crystal manufacturing method set forth in claim 6, wherein in said separation step, the laser beam is directed at the interface between the compound semiconductor single crystal (8) and the starting substrate (3) to remove at least a portion of the starting substrate (3), thereby separating the starting substrate (3) from the compound semiconductor single crystal (8).

9. The compound semiconductor single-crystal manufacturing method set forth in claim 6, wherein in said crystal growth step, the compound semiconductor single crystal (8) is grown with the starting substrate (3) being heated at a temperature higher than the temperature of the space inside the reaction vessel (2).

10. The compound semiconductor single-crystal manufacturing method set forth in claim 6, wherein the progress status of said sublimation step is monitored by detecting a change of state in the starting substrate (3) from the laser beam being shone on the starting substrate (3).

11. The compound semiconductor single-crystal manufacturing method set forth in claim 6, wherein said sublimation step, said crystal growth step, and said separation step are carried out in succession and automatedly.

* * * * *